(12) United States Patent  
Murphy

(10) Patent No.: US 6,213,787 B1
(45) Date of Patent: Apr. 10, 2001

(54) SOCKET/ADAPTER SYSTEM

(75) Inventor: James V. Murphy, Warwick, RI (US)

(73) Assignee: Advanced Interconnections Corporation, West Warwick, RI (US)

( * ) Notice: Subject to any disclaimer, the term of this patent is extended or adjusted under 35 U.S.C. 154(b) by 0 days.

(21) Appl. No.: 09/464,415

(22) Filed: Dec. 16, 1999

(51) Int. Cl.$^7$ .................................................. H01R 12/00
(52) U.S. Cl. .......................... 439/71; 439/331; 361/767
(58) Field of Search .................. 439/70, 71, 525, 439/526, 331; 361/760, 767, 768, 769, 783, 785, 791, 803, 804

(56) References Cited

U.S. PATENT DOCUMENTS

| | | | | |
|---|---|---|---|---|
| 4,442,938 | * | 4/1984 | Murphy | 206/329 |
| 5,038,467 | * | 8/1991 | Murphy | 29/845 |
| 5,151,040 | * | 9/1992 | Tanaka | 439/73 |
| 5,287,617 | * | 2/1994 | Murphy | 29/741 |
| 5,481,435 | * | 1/1996 | Werther | 439/70 |
| 5,917,703 | * | 6/1999 | Murphy | 361/704 |

OTHER PUBLICATIONS

Advanced Interconnections, Catalog No. 14, p. 162, 1996.*

* cited by examiner

Primary Examiner—Tulsidas Patel
(74) Attorney, Agent, or Firm—Fish & Richardson P.C.

(57) ABSTRACT

A socket terminal assembly includes a socket body having an end with an opening and an opposite end configured to contact the corresponding connection region of a printed circuit board, a contact spring, disposed at the opening of the socket body, to receive and apply a frictional force sufficient to retain the lower end of a pin within the opening of the socket body; and a resilient member, disposed within a lower end of the opening, to apply, to the pin and in response to a downward force applied to the pin, an upward force sufficient to overcome the frictional force of the contact spring. The pin has an end adapted to contact an electrical contacting area of an integrated circuit package and an opposite end configured to be inserted within the opening of the socket body. An intercoupling component includes a socket support member having holes, each hole receiving a corresponding socket terminal assembly.

18 Claims, 6 Drawing Sheets

SOCKET/ADAPTER SYSTEM

BACKGROUND OF THE INVENTION

This invention relates to making connections between integrated circuit array packages (IC) and circuit boards.

As is known in the art, integrated circuit (IC) packages can have anywhere from a few to in excess of one thousand pins. The IC packages are often soldered directly to a circuit board to assure a relatively permanent connection between the IC package and board. However, in some applications, it may be desired that the package be mounted indirectly to the board through an electrical socket. In this way, the integrated circuit can be replaced or removed for testing without the need for reheating solder joints which may, in some cases, cause damage to the integrated circuit and board.

Certain socket adapters, including those used for pin grid arrays (PGAs), ball grid arrays (BGAs) and land grip arrays (LGAs), utilize a male terminal which is received within a female socket. The female sockets generally include spring contacts to ensure reliable electrical and mechanical connections between the male terminal and female socket. If the package has a small number of pins the forces associated with each pin and socket terminal are relatively insignificant. However, for IC packages and sockets/adapters having a larger number of pins, the aggregate force of the many pin/socket terminal connections can become quite high.

SUMMARY OF THE INVENTION

This invention features an intercoupling component (e.g., socket or adapter) which provides a reliable, non-permanent and low-loss electrical interconnection between electrical contacting areas of an array package and connection regions of a substrate (e.g., printed circuit board), particularly for high density integrated circuit packages having many electrical contacting areas (e.g., greater than 200). The term "integrated circuit array package" is intended to mean those packages, including PGA, BGA and LGA packages having electrical contacting areas in the form of pins, balls, and contact pads, respectively. The term "substrate" is intended to mean any base member having electrical contact areas including printed circuit boards, IC chip substrates or the packages supporting such chip substrates.

In one aspect of the invention, the intercoupling component includes socket terminal assemblies, a socket support member including first openings configured to receive a corresponding one of the socket terminal assemblies, and a stiffening member, mechanically coupled to the socket support member, including second openings configured to receive a corresponding one of the socket terminal assemblies. Each socket terminal assembly includes a socket body having an end configured to contact the corresponding connection region of the substrate and an opposite end with an opening configured to receive an end of a pin.

The stiffening member virtually eliminates any possibility of the socket support member bending or becoming bowed due to large forces generated when the numerous pins are depressed within the sockets. Bowing can generate pulling forces, which can cause separation of the solder joint from the printed circuit board. Because the amount of force, and potential for "bowing" increases with the number of contacts (e.g., pins, balls, lands) of the integrated circuit package, the stiffening member is particularly important for packages having a large number of contacts.

Embodiments of this aspect of the invention may include one or more of the following features.

The stiffening member is formed of a material (e.g., aluminum) having an elastic modulus characteristic greater than 5 MPsi ($5 \times 10^6$ Psi) and preferably greater than 10 MPsi. The stiffening member has a thickness in a range between 0.020 inches and 0.200 inches.

The intercoupling component further includes an insulative member positioned between the stiffening member and the connection regions of the substrate. In certain embodiments, the insulative member encapsulates the stiffening member. In embodiments in which the stiffening member is formed of an electrically conductive member, the insulative member electrically isolates the stiffening member from electrically conductive areas of the printed circuit board. Thus, the opportunity for inadvertent electrical "short circuits" is minimized.

The stiffening member includes guide elements for aligning the electrical contacting areas of the integrated circuit package with the corresponding connection region of the substrate. For example, the guide elements can be in the form of upstanding sidewalls along which peripheral edges of the IC package are guided to align solder balls of a BGA package over corresponding converter socket terminals.

In certain embodiments, each socket terminal assembly includes a contact spring (e.g., resilient spring fingers), disposed at the opening of the socket body. The contact spring is configured to provide a "wiping", reliable electrical contact in which the frictional force sufficient to retain the pin within the socket body is in a direction substantially transverse to the upward force applied by the resilient member. For example, the contact spring includes resilient spring fingers which frictionally engage the lower end of the pin.Each socket terminal assembly includes a resilient member, disposed within the opening, to apply, in response to a downward force applied to the pin, an upward force to the pin sufficient to overcome the frictional force of the contact spring. The resilient member for applying the upward force, on the other hand, is in the form of a coiled conductive spring, or alternatively, in the form of an elastomeric material (e.g., rubber). The frictional force applied by the contact spring is in a direction substantially transverse to the direction of the upward force applied by the resilient member.

The end of the socket body is configured to contact the corresponding connection region of the substrate is ball-shaped, for example, formed as a solder ball.

The intercoupling component further includes an electrically insulative retaining sheet (e.g., a polyimide film) coupled to a corresponding pin, having a plurality of holes arranged in a pattern corresponding to the pattern of the connection contacts, each hole adapted to retain the pins.

The intercoupling component further includes a member for applying a downward force on the contact area of the integrated circuit package and to each pin to cause the resilient member to compress. The member for applying the downward force is a heat sink threadingly received within a cover positioned over the integrated circuit package. The socket support member includes alignment elements to align the contacting area of the integrated circuit package to corresponding ones of the connection regions.

Other features of the invention will be apparent from the following description of the preferred embodiments and from the claims.

DETAILED DESCRIPTION

Figure 1:
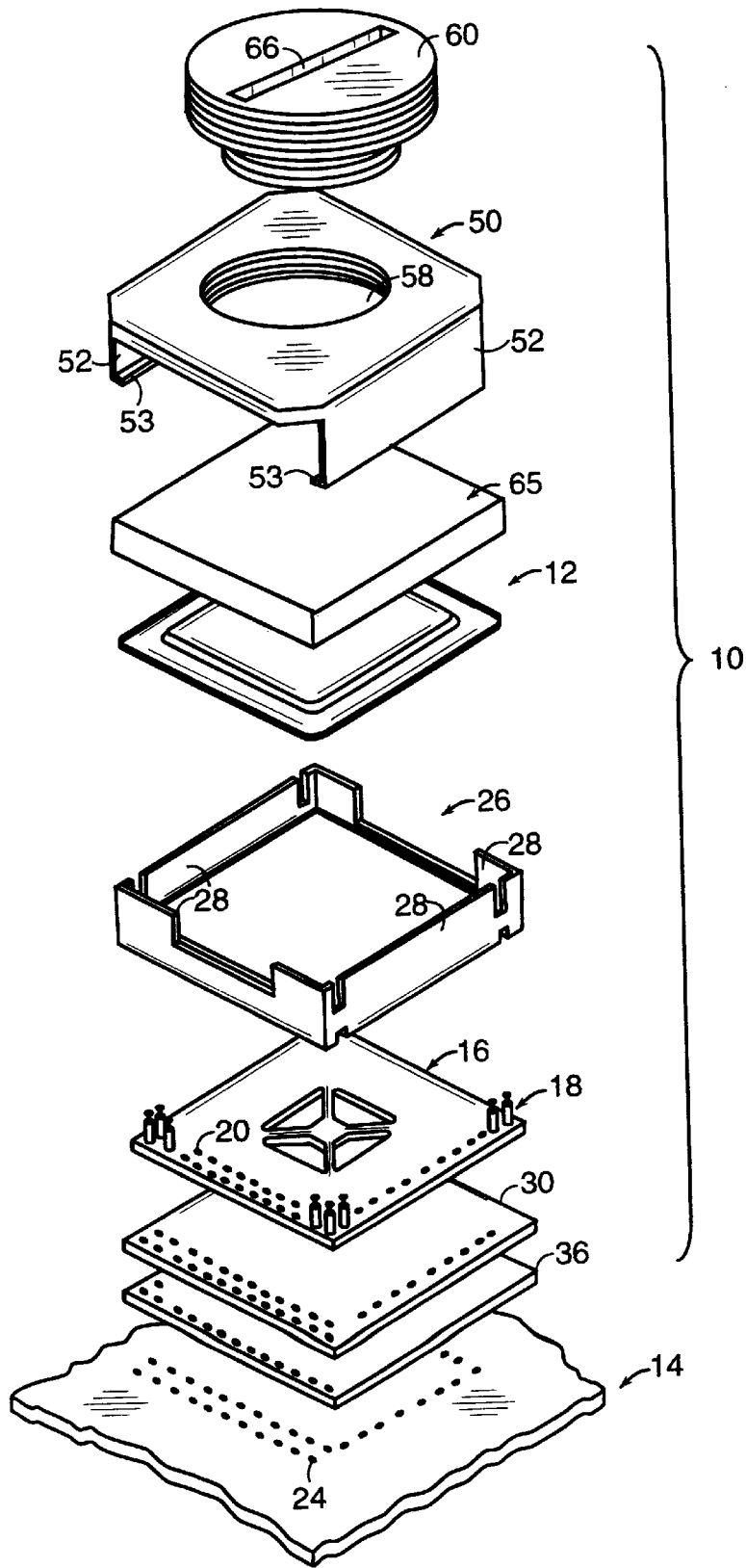
FIG. 1 is an exploded, somewhat diagrammatic, isometric view of a BGA converter socket assembly, a BGA package, and hold-down assembly positioned over a printed circuit board.
Figure 2:
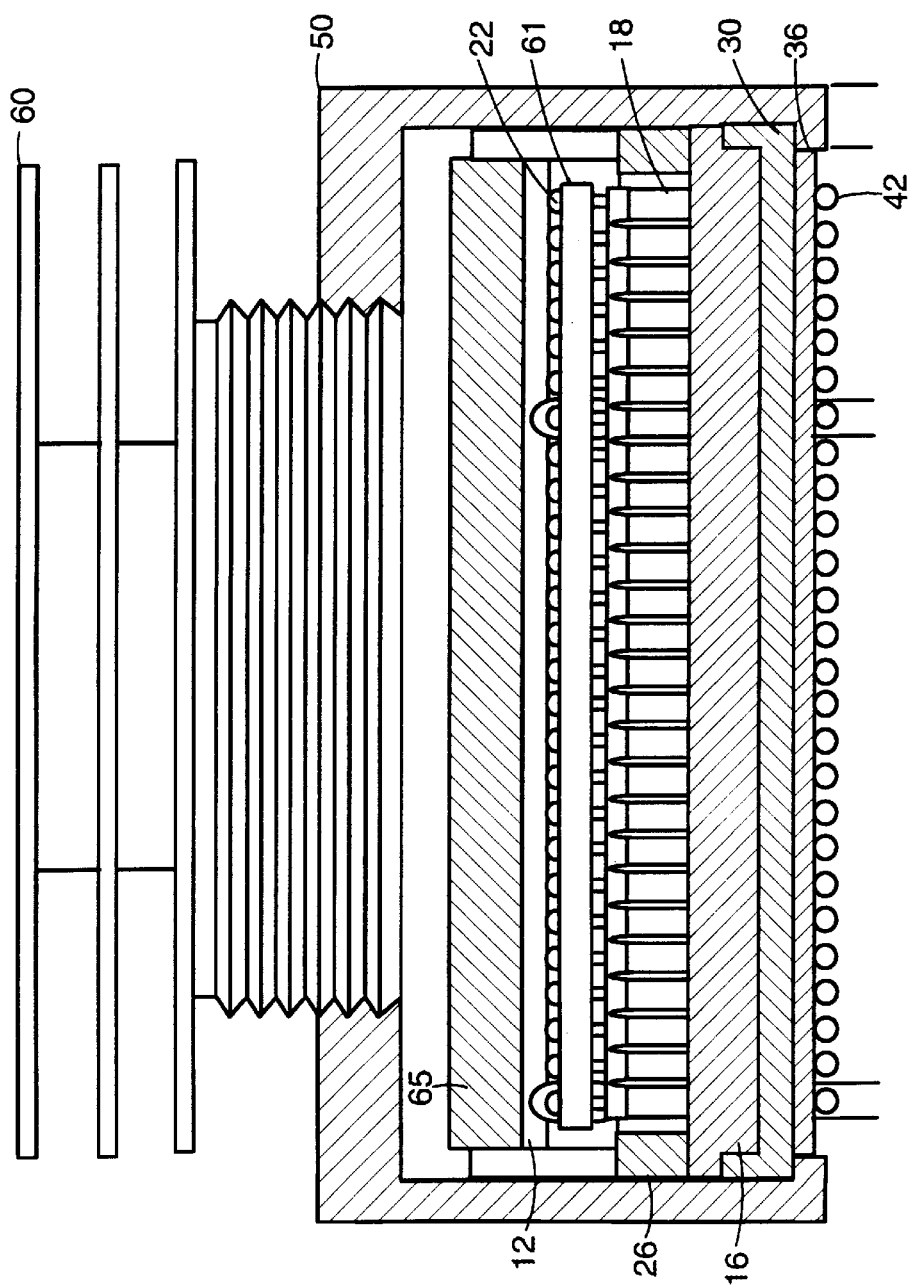
FIG. 2 is a cross-sectional side view of a portion of the BGA converter socket assembly of FIG. 1.
Figure 4:
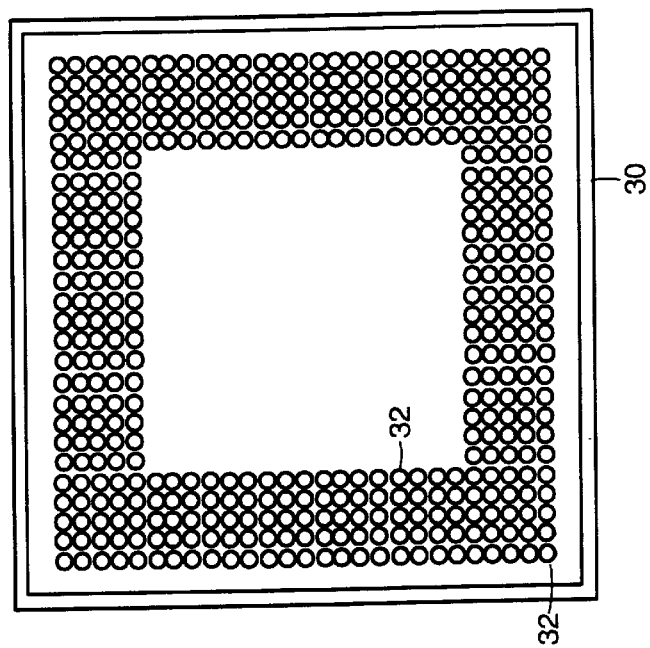
FIG. 4 is a top view of a stiffening member of the BGA converter socket of FIG. 1.

Referring to FIGS. 1 and 2, a BGA socket converter assembly 10 for intercoupling a BGA package 12 to a printed circuit board 14 is shown. BGA socket converter assembly 10, serving as an intercoupling component, includes an electrically insulative member 16 for supporting converter socket terminals 18, each of which is press-fit within a corresponding one of an array of holes 20 (FIG. 1) in the insulative member. The array of holes 20 are provided in a pattern corresponding to a footprint of rounded solder ball contacts 22 of EGA package 12 as well as a footprint of surface mount pads 24 of printed circuit board 14. In this embodiment, BGA package 12 includes five hundred and forty solder ball contacts. However, socket converter assembly 10 is applicable for use with packages having different numbers of contacts —particularly those with greater number of contacts. Indeed, BGA packages with as many 5,000 solder ball contacts are presently being used in the industry.

Insulative member 16 with converter socket terminals 18 is press-fit into a guide box 26 having sidewalls 28 along which the peripheral edges of BGA package 12 are guided so that solder balls 22 are aligned over converter socket terminals 18.

Figure 3A:
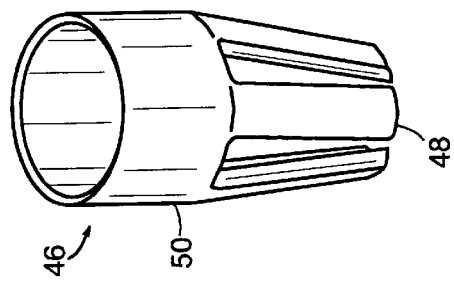
FIG. 3A is a perspective view of a contact spring of the BGA converter socket assembly of FIG. 1.
Figure 3:
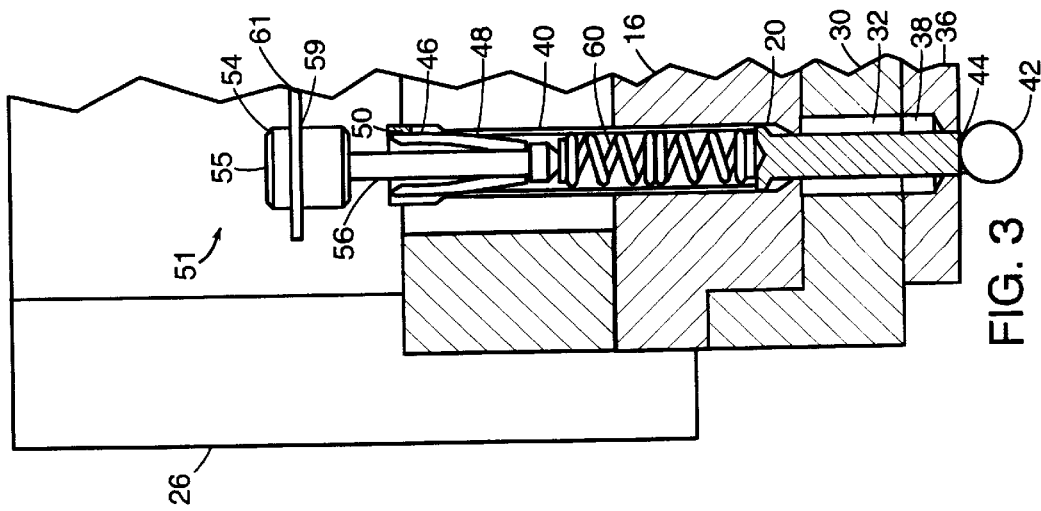
FIG. 3 is an enlarged, cross-sectional side view of a portion of the BGA converter socket assembly of FIG. 2.

Referring to FIG. 3, each converter socket terminal 18 includes a female socket 40 positioned within one of the array of holes 20 of insulative member 16. Female socket 40 includes a solder ball 42 pre-attached (e.g., by soldering) to its bottom end 44 to provide an identical mating condition to surface mount pads 24 (FIG. 1) as would have been the case had BGA package 12 been connected directly to the printed circuit board 14. Solder balls 42 are eventually soldered to corresponding surface mount pads 24 of circuit board 14. Positioned within the interior of female socket 40 is a contact spring 46 press-fit within the interior and upper end of the female socket.

Referring to FIG. 3A, each contact spring 46 includes spring leaves 48 attached at circumferentially spaced points of a barrel 50. Contact spring 46 is sized to receive a male terminal 51 which passes through barrel 50 to frictionally engage spring leaves 48. Contact springs of this type are commercially available from Advanced Interconnections, West Warwick, RI or other stamping outfits providing such contact springs (e.g., in an open-tooling arrangement). Spring leaves 48 provide a "wiping", reliable electrical contact to the male terminal pins by applying a frictional force in a direction substantially transverse to the longitudinal axis of the male terminals sufficient to retain the pin within the socket body.

Figure 5:
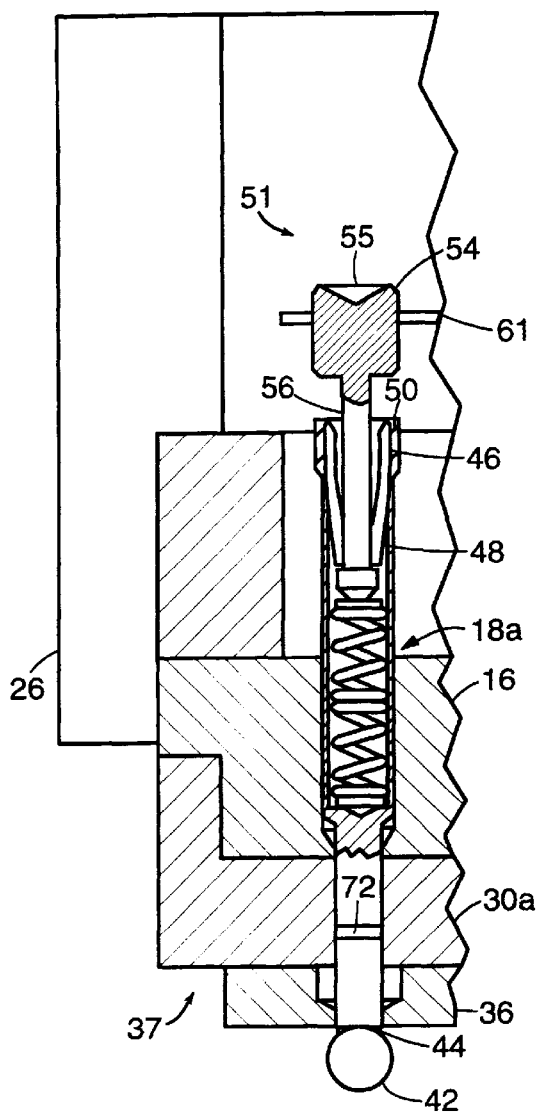
FIG. 5 is an enlarged, cross-sectional side view of an alternative embodiment of a portion of a BGA converter socket assembly.

Each male terminal 51 has a head 54 adapted to receive a corresponding ball 22 of the BGA package 12 and a pin 56, thereby forming an electrical connection between ball 22 of package 12 and solder ball 42 of converter socket terminal 18. Referring to FIG. 5, head 54 has a concave upper surface 55 for accommodating the rounded shape of solder ball 22. Each of pins 56 are received within corresponding contact springs 46 with spring leaves 48 configured to provide a lateral force, generally transverse to the longitudinal axis of pins 56, thereby frictionally engaging outer surfaces of the pins.

Metallic coiled springs 60 are loosely positioned within the interiors of each of female sockets 40 and provide an upward force to the lower ends of pins 56. As mentioned earlier, spring leaves 48 of contact springs 46 provide a sufficient amount of lateral frictional force generally transverse to the longitudinal axis of the pins, to ensure a reliable electrical contact to pins 56 of male terminals 51. However, as will be described in greater detail below, when a holddown cover 50 is removed from insulative member 16, guide box 26 and BGA package 12, metallic coiled springs 60 expand causing each of male terminal 51 to release and extend to their most vertical position within female sockets 40. Thus, it is important that coiled springs 60 provide an upward force to male terminal 51 that overcomes the frictional force, transverse to the upward force, applied by spring leaves 48. The upward force of coiled springs 60 also minimizes the risk of pins 56 "sticking" within corresponding female sockets 40. Further details relating to the operation of converter socket terminal 18 are described in U.S. Pat. No. 5,877,554, which is incorporated herein by reference.

BGA socket converter assembly 10 also includes a stiffening member 30 formed of a relatively rigid material and having sufficient thickness (e.g., 0.130 inches) to mechanically support insulative member 16 when the BGA socket converter is assembled. In particular, when male terminal 51 are inserted within corresponding contact springs 46 to expand spring leaves 48, insulative member 16 is subjected to tremendous force. The overall force is the sum of the individual forces associated with each male terminal/contact spring pair. Thus, in embodiments where the pin count is high (e.g., greater than 250), the biasing force within contact springs 46 can be sufficient to cause insulative support member 16 to bend or bow. Bending of the support member can jeopardize the reliability of maintaining electrical connections between solder ball contacts 22 of BGA package 12 and surface mount pads 24 of printed circuit board 14. Indeed, bowing can cause the solder joints between the printed circuit board and solder balls to break.

Stiffening member 30 includes an array of holes 32 corresponding to the array of holes 20 of insulative member 16 through female sockets 40 of converter socket terminals 18 extend. In the embodiment shown in the figures, stiffening member 30 is formed of aluminum, an electrically conductive material. In such embodiments, an insulative sheet member 36 is positioned between stiffening member 30 and printed circuit board 14 to prevent possible electrical short circuiting between electrically conductive devices (e.g., terminals, etc.) on the printed circuit board and stiffening member 30. Insulative sheet member 36 serves an additional important function. Specifically, insulative sheet member 36 also includes an array of holes 38 corresponding to the array of holes 32 of stiffening member 30. Holes 38 have a diameter at an opening on the upper surface of insulative member 36 which is larger than the diameter of female sockets 40. However, the diameter of the opening at the bottom surface of insulative member 36 is sized to provide a relatively snug fit between female socket 40 and the insulative sheet member. This tight fit prevents, during the soldering of solder ball 42 to contact surface 44, the solder from wicking up the bottom portion of female socket 40.

In alternative embodiments, stiffening member 30 may be formed of a rigid, electrically insulative material (e.g., insulative composite). In such embodiments, insulative sheet member 36 may not be required, thereby advantageously reducing the overall height of BGA converter socket assembly 10. Of course, in such embodiments, holes 32 of stiffening member 30 would be sized to provide the snug fit discussed above with respect to insulative sheet member 36.

Referring again to FIGS. 1 and 2, BGA socket converter assembly 10 also includes hold-down cover 50 for securing the BGA package 12 into the socket converter assembly. Cover 50 includes a pair of opposite walls 52 having tab members 53 which engage recessed portions 37 along the underside of stiffening member 30. Hold-down cover 50 includes a threaded thru-hole 58 which threadingly receives a heat sink 60 to provide a thermal path for dissipating heat from the IC device generated within BGA package 12. A slot 66 is formed in the heat sink and facilitates threading the heat sink within the cover, for example, with a screwdriver or coin. Other latching mechanisms (e.g., clips or catches) may also be used to secure BGA packages within the socket converter assembly. It is also appreciated that other heat sink arrangements, including Those with increased surface area (e.g. heat sinks with finned arrangements), may be substituted for the version shown in FIG. 1. In some applications, a heat sink may not be required with only the cover providing the downward compressing force to the BGA package.

BGA socket converter assembly 10 also includes a pressure distribution plate 65 formed of a rigid material (e.g., aluminum) positioned between cover 50 and BGA package 12. In essence, pressure distribution plate 65 serves to protect BGA package by eliminating localized pressure points and more uniformly distributing the force applied by heat sink 60 when it is tightened into position within cover 50.

Referring again to FIGS. 2 and 3, head 54 of each male terminal 51 also includes a V-groove 59 used to capture a relatively thin polymeric sheet 61 made, for example from Kapton® (a product of E.I. DuPont de Nemours and Co., Wilmington, DP. Sheet 61 (not shown in FIG. 1 for purposes of clarity) includes openings sized slightly smaller than the diameter of the heads 54. This arrangement maintains male terminals 51 together in proper spaced relationship so that the pins can be easily aligned over and inserted into female sockets 40. Sheet 61 also prevents tilting of the pins which can cause electrical shorting.

Other embodiments are within the following claims.

For example, in certain applications, a stiffening member may be used to establish electrical connections between one or more converter socket terminals 18.

Referring to FIG. 5, for example, a stiffening member 30*a* is formed of an electrically conductive material (e.g., aluminum) and is sized to contact the outer surface of particular ones of converter socket terminals 18*a*. Converter socket terminal 18*a* includes a barbed portion 72 to ensure reliable electrical contact with stiffening member 30*a*. In one application, stiffening member 30*a* may be used to provide a ground plane with preselected ones of converter socket terminals 18*a* establishing contact to the ground plane.

Figure 7:
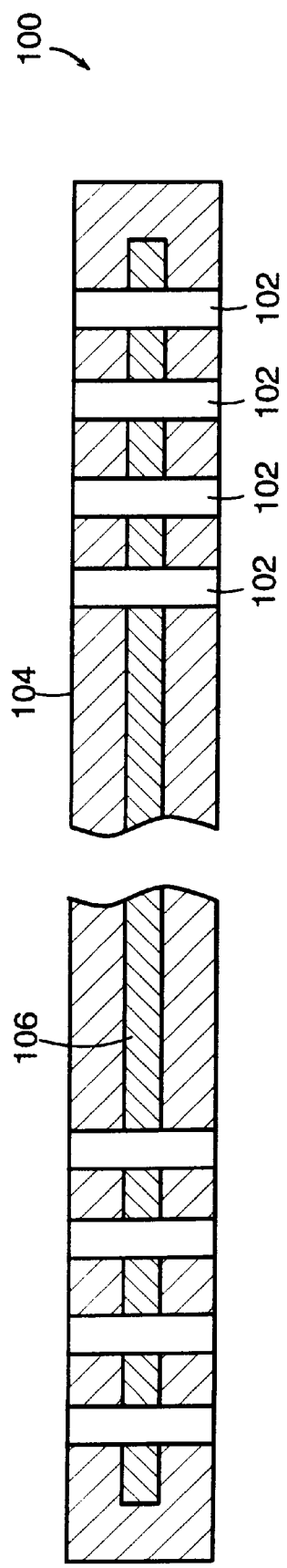
FIG. 7 is a cross-sectional side view of an alternative embodiment of a stiffening member.

Referring to FIG. 7, in another embodiment, a stiffening member 100 having an array of holes 102 can be formed of a molded insulative material (e.g., plastic) 104 that encapsulates a metal conductive ground plane 106.

Figure 8B:
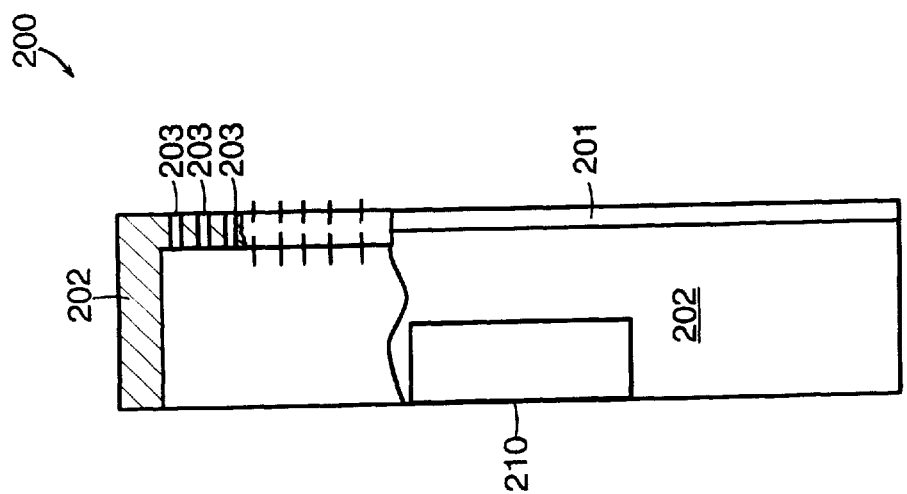
FIGS. 8A and 8B are plan and cross-sectional side views of an alternative embodiment of a stiffening member.
Figure 8A:
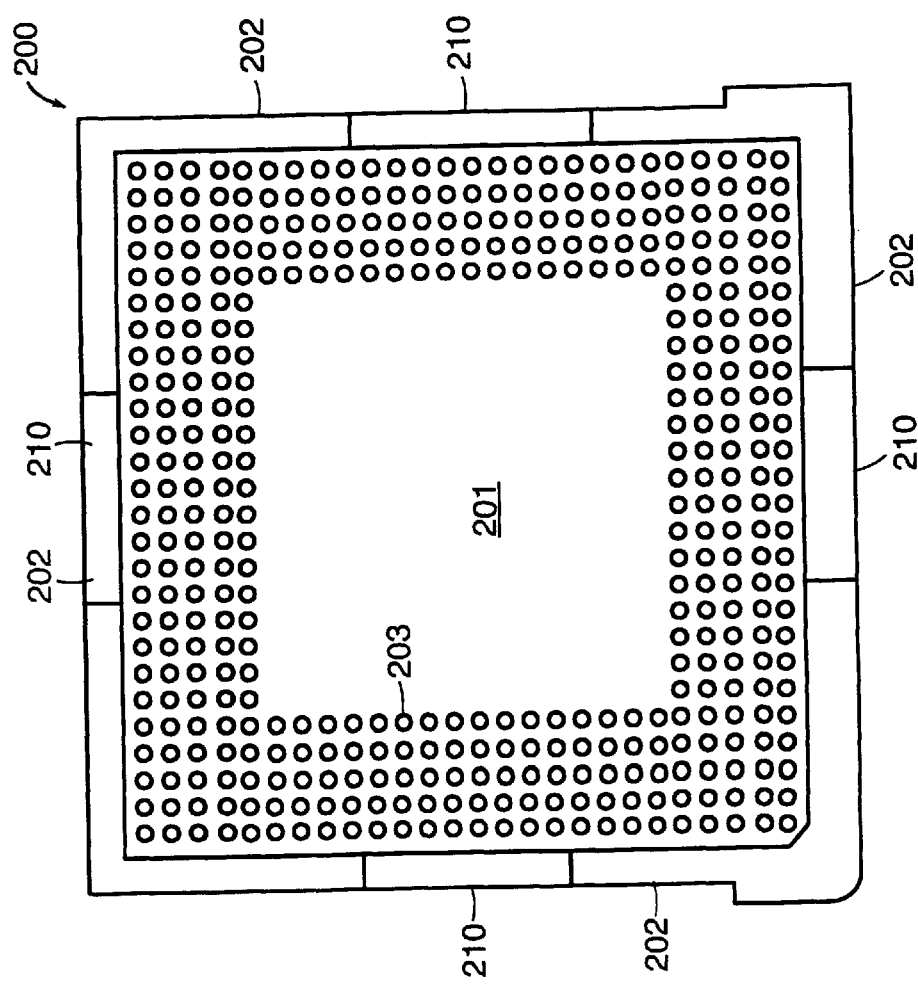

In still another embodiment, the stiffening member and guide box can be formed as an integral unit. For example, referring to FIGS. 8A and 8B, a stiffening box 200 includes sidewalls 202 attached to the peripheral edges of stiffening member 201 having an array of holes 203. Peripheral edges of BGA package 12, insulative member 16, and pressure distribution plate 65 are guided along sidewalls 202 so that solder balls 22 of the BGA package are aligned over converter socket terminals 18 of the insulative member. Apertures 210 are formed within sidewalls 202 to allow the flow of air for cooling and to facilitate manual removal of the BGA package from the stiffening box 200.

Figure 6:
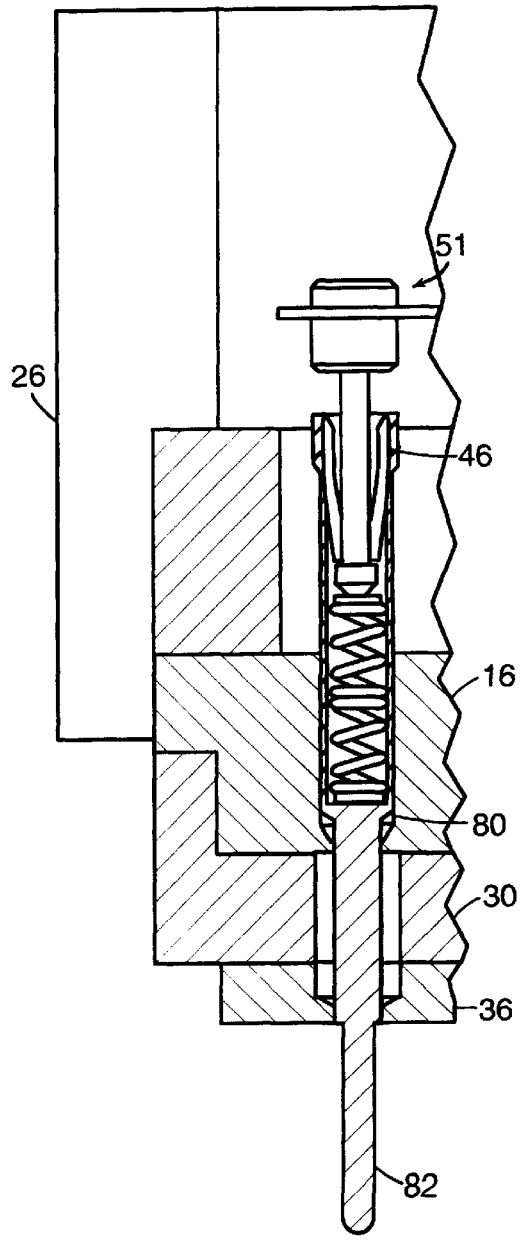
FIG. 6 is a cross-sectional side view of an alternative embodiment of a BGA converter socket assembly.

In general, the advantages of stiffening members 30, 30*a* is not limited to socket/adapter configurations which duplicate the mating condition between a BGA package and printed circuit board, as is the case in the embodiment shown in FIGS. 1–5. For example, referring to FIG. 6, converter socket terminal 80 is shown to include a male terminal pin 82, rather than a solder ball contact. In such an embodiment, BGA converter socket serves to convert the BGA package into a pin grid array (PGA).

Furthermore, in the embodiment described above in conjunction with FIGS. 1–3, uses a separate stiffening member 30 and insulative sheet member 36. In other embodiments, however, the stiffening member can be encapsulated within an insulative material to provide electrical isolation between the electrically conductive stiffening member and printed circuit board.

Other contact spring arrangements may be substituted for the contact spring 48 of BGA socket converter assembly 10, such as those described in U.S. Pat. No. 5,877,544.

It is also appreciated that in the above described embodiments, other forms of spring members may be substituted for coiled springs 60 (FIG. 3), such as spring-like members formed of elastomeric (e.g., rubber) or shape-memory materials. Such materials are equally applicable so long as they provide the necessary upward force needed to overcome the frictional forces of contact springs 46.

Still further embodiments are supported by the following claims.

What is claimed is:

1. An intercoupling component configured to electrically connect an electrical contacting area of an integrated circuit package to a corresponding connection region of a substrate, the intercoupling component comprising:

a plurality of socket terminal assemblies, each socket terminal assembly including a socket body having an end configured to contact the corresponding connection region of the substrate and an opposite end with an opening configured to receive an end of a pin configured to be electrically connected to the electrical contacting area of the integrated circuit package;

a socket support member including first openings extending therethrough from an upper surface to an opposite lower surface, each opening configured to receive a corresponding one of the socket terminal assemblies;

a stiffening member, mechanically coupled to the socket support member, the stiffening member including second openings extending therethrough from an upper surface to an opposite lower surface, each second opening configured to receive a corresponding one of the socket terminal assemblies, the stiffening member formed of an electrically conductive material; and an insulative member positioned between the stiffening member and the connection region of the substrate.

2. The intercoupling component of claim 1 wherein the electrically conductive member has an elastic modulus characteristic greater than 5 MPsi.

3. The intercoupling component of claim 2 wherein the stiffening member has a thickness in a range between 0.020 inches and 0.200 inches.

4. The intercoupling component of claim 2 wherein the stiffening member includes guide elements for aligning the electrical contacting area of the integrated circuit package with the corresponding connection region of the substrate.

5. The intercoupling component of claim 1 the electrically conductive stiffening member is encapsulated with an electrically insulative material.

6. The intercoupling component of claim 1 wherein each socket terminal assembly includes a contact spring, disposed at the opening of the socket body, to receive and apply a frictional force sufficient to retain the pin within the opening of the socket body.

7. The intercoupling component of claim 1 wherein each socket terminal assembly includes a resilient member, disposed within the opening, to apply, in response to a downward force applied to the pin, an upward force to the pin sufficient to overcome the frictional force of the contact spring.

8. The intercoupling component of claim 7 wherein the frictional force applied by the contact spring is in a direction substantially transverse to the direction of the upward force applied by the resilient member.

9. The intercoupling component of claim 8 wherein the contact spring includes resilient spring fingers.

10. The intercoupling component of claim 8 wherein the resilient member includes a coiled conductive spring.

11. The intercoupling component of claim 8 wherein the resilient member is formed of an elastomeric material.

12. The intercoupling component of claim 1 wherein the end of the socket body configured to contact the corresponding connection region of the substrate is ball-shaped.

13. The intercoupling component of claim 12 wherein the ball-shaped end of the socket body is formed of a solder ball.

14. The intercoupling component of claim 1 further comprising an electrically insulative sheet coupled to a corresponding pin, having a plurality of holes arranged in a pattern corresponding to the pattern of the connection contacts, each hole adapted to retain the pins.

15. The intercoupling component of claim 14 wherein the retaining sheet is a polyimide film.

16. The intercoupling component of claim 7 further comprising a member for applying a downward force on the contact area of the integrated circuit package and to each pin to cause the resilient member to compress.

17. The intercoupling component of claim 16 wherein the member for applying the downward force is a heat sink threadingly received within a cover positioned over the integrated circuit package.

18. The intercoupling component of claim 1 wherein the socket support member includes alignment elements to align the contacting area of the integrated circuit package to corresponding ones of the connection regions.

* * * * *

UNITED STATES PATENT AND TRADEMARK OFFICE
CERTIFICATE OF CORRECTION

PATENT NO. : 6,213,787 B1
DATED : April 10, 2001
INVENTOR(S) : James V. Murphy

Page 1 of 1

It is certified that error appears in the above-identified patent and that said Letters Patent is hereby corrected as shown below:

Column 3,
Line 29, "EGA" should be -- BGA --.

Column 5,
Line 29, "Those" should be -- those --.
Line 47, "DP" should be -- DE --.

Signed and Sealed this

Sixteenth Day of April, 2002

Attest:

Attesting Officer

JAMES E. ROGAN
Director of the United States Patent and Trademark Office